(12) United States Patent
Königsmann et al.

(10) Patent No.: US 10,530,355 B1
(45) Date of Patent: Jan. 7, 2020

(54) CONTROL DEVICE FOR POWER SEMICONDUCTOR SWITCH

(71) Applicant: SEMIKRON ELEKTRONIK GMBH & CO. KG, Nuremberg (DE)

(72) Inventors: Gunter Königsmann, Langensendelbach (DE); Johannes Krapp, Schwabach (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 16/362,078

(22) Filed: Mar. 22, 2019

(30) Foreign Application Priority Data

Mar. 26, 2018 (DE) .................. 10 2018 107 146

(51) Int. Cl.
  *H03K 17/0812* (2006.01)
(52) U.S. Cl.
  CPC ............ *H03K 17/08128* (2013.01); *H03K 2217/0027* (2013.01)
(58) Field of Classification Search
  None
  See application file for complete search history.

(56) References Cited

U.S. PATENT DOCUMENTS

| | | | | |
|---|---|---|---|---|
| 7,933,105 B2* | 4/2011 | Yamawaki | ........... | H03K 17/168 361/79 |
| 8,362,812 B2* | 1/2013 | Lee | .......... | H02M 1/08 327/109 |

(Continued)

FOREIGN PATENT DOCUMENTS

DE 10 2015 120 166 11/2016

OTHER PUBLICATIONS

DE 10 2018 107 146.9 Office Action dated Feb. 7, 2019; German 7-pages; English 4-pages.

*Primary Examiner* — Jeffery S Zweizig
(74) *Attorney, Agent, or Firm* — Lackenbach Siegel, LLP; Andrew F. Young

(57) ABSTRACT

A control device for a power semiconductor switch includes an actuating device, which on a third control device terminal, upon the reception of a switching on command, generates an actuating voltage for the switching on of the power semiconductor switch and, upon the reception of an switching off command, generates an actuating voltage for the switching off of the power semiconductor switch, and a current detection circuit, which generates a first high-current signal if an actuating voltage assumes a voltage value at which the power semiconductor switch is switched on, and a primary voltage of the power semiconductor switch applied between first and second control device terminals exceeds a first power semiconductor switch primary voltage value. The actuating device, upon the reception of an switching off command, generates an actuating voltage for the switching off of the power semiconductor switch, such that the actuating voltage is reduced such that the time interval elapsing between a first actuating voltage value, assumed by the actuating voltage upon the reception of the switching off command, and the achievement of a second actuating voltage value of the actuating voltage, which is equal to 10% of the first actuating voltage value, is greater in the presence of the first high-current signal than in the absence of the first high-current signal.

5 Claims, 5 Drawing Sheets

(56) References Cited

U.S. PATENT DOCUMENTS

| | | | |
|---|---|---|---|
| 8,810,984 B2 * | 8/2014 | Hussein | H03K 17/0828 361/93.1 |
| 8,823,354 B2 * | 9/2014 | Gan | H02M 1/088 323/289 |
| 9,209,618 B2 * | 12/2015 | Mari Curbelo | H03K 17/78 |
| 9,634,657 B1 | 4/2017 | Zoels et al. | |
| 9,685,955 B2 * | 6/2017 | Choi | H03K 17/08128 |
| 10,038,434 B2 * | 7/2018 | Volke | H02M 1/088 |
| 10,374,594 B2 * | 8/2019 | Kaeriyama | H03K 17/0828 |
| 2015/0326009 A1 | 11/2015 | Mari Curbelo et al. | |

* cited by examiner

CONTROL DEVICE FOR POWER SEMICONDUCTOR SWITCH

CROSS REFERENCE TO RELATED APPLICATIONS

This application relates to, and claims priority from, DE Ser. No.:10 2018 107 146.9 filed Mar. 26, 2018, the entire contents of which are incorporated herein by reference.

FIGURE SELECTED FOR PUBLICATION

FIG. 1.

BACKGROUND OF THE INVENTION

Field of the Invention

The present invention relates to a control device for a power semiconductor switch.

Description of the Related Art

Upon the switching off of a power semiconductor switch, as a result of stray inductances in conductors which are electrically connected thereto, in particular in the event of a high load current flowing through the power semiconductor switch, overvoltages can occur between the load current terminals of the power semiconductor switch which can result in the damage or destruction of said power semiconductor switch. The higher the switching off speed of the power semiconductor switch or the shorter the interruption time, the greater these overvoltages will be, as a result of the increase in the associated rate of variation of the load current. However, a reduction in the switching off speed applied for the switching off of the power semiconductor switch has a disadvantage in that, upon the switching off of the power semiconductor switch, energy losses on the power semiconductor switch are increased, thereby reducing the electrical efficiency of the power semiconductor switch.

A control device for a power semiconductor switch is known from DE 10 2015 120 166 B3, which monitors the load current flowing in the power semiconductor switch. If the load current in the switching on state of the power semiconductor switch, e.g. in the event of a short-circuit, becomes very high, the voltage applied between the first and second load current terminals of the power semiconductor switch rises substantially, thereby resulting in a voltage rise on a first input of a comparator of the control device. If the voltage on the first input of the comparator exceeds a reference voltage applied to a second input, the comparator generates an overcurrent fault signal, which results in the permanent switching off of the power semiconductor switch. The power semiconductor switch is thus protected against the overcurrent flowing therein.

ASPECTS AND SUMMARY OF THE INVENTION

The object of the invention is the provision of a control device for a power semiconductor switch which, in the normal duty of the power semiconductor switch, permits the operation of the power semiconductor switch with a high degree of efficiency and, in the event of a high electric current flowing in the power semiconductor switch, upon the switching off of said power semiconductor switch, reduces overvoltages between the load current terminals of the power semiconductor switch.

This object is fulfilled by a control device for a power semiconductor switch having a first and a second load current terminal and a control terminal, comprising:

a first electrical control device terminal, which is provided for electrical connection with the first load current terminal, a second electrical control device terminal, which is provided for electrical connection with the second load current terminal, and a third electrical control device terminal, which is provided for electrical connection with the control terminal, an actuating device, which is designed, on the third control device terminal, upon the reception of a switching on command, to generate an actuating voltage for the switching on of the power semiconductor switch and, upon the reception of an switching off command, to generate an actuating voltage for the switching off of the power semiconductor switch, a current detection circuit, which is designed to generate a first high-current signal if the actuating voltage assumes a voltage value at which the power semiconductor switch is switched on, and a primary voltage of the power semiconductor switch applied between the first and second control device terminals exceeds a first power semiconductor switch primary voltage value, wherein the actuating device is configured, upon the reception of an switching off command, to generate an actuating voltage for the switching off of the power semiconductor switch, such that the actuating voltage is reduced such that the time interval elapsing between a first actuating voltage value, assumed by the actuating voltage upon the reception of the switching off command, and the achievement of a second actuating voltage value of the actuating voltage, which is equal to 10% of the first actuating voltage value, is greater in the presence of the first high-current signal than in the absence of the first high-current signal.

Advantageous configurations of the invention further include if the control device is configured for the reception of an intermediate circuit voltage value, and the first power semiconductor switch primary voltage value is dependent upon the intermediate circuit voltage value such that the first power semiconductor switch primary voltage value in the event of a high intermediate circuit voltage value is lower than in the event of a low intermediate circuit voltage value. If the power semiconductor switch is a constituent of a half-bridge circuit, of the conventional type employed in power electronics, the intermediate circuit voltage of the half-bridge circuit will be present on the half-bridge circuit. In the event of a high intermediate circuit voltage, the power semiconductor switch, in the switching off state, receives a higher voltage load than in the event of a low intermediate circuit voltage. It is therefore advantageous for the first power semiconductor switch primary voltage value, in the event of a high intermediate circuit voltage, to be lowered, such that the current detection circuit generates the first high-current signal, even in the event of a relatively small load current.

It has moreover proved to be advantageous if the actuating device is configured, upon the reception of an switching off command, to generate an actuating voltage for the switching off of the power semiconductor switch, such that the actuating voltage is reduced such that the time interval elapsing between a first actuating voltage value, assumed by the actuating voltage upon the reception of the switching off command, and the achievement of a second actuating voltage value of the actuating voltage, which is equal to 10% of the first actuating voltage value, in the presence of the first high-current signal, is at least 10% greater, in particular at least 20% greater, than in the absence of the first high-current signal. By this arrangement, during an switching off process of the power semiconductor switch, a clearer reduction in the rate of current variation is achieved.

It has moreover proved to be advantageous if the current detection circuit is configured to generate a second high-current signal, if the actuating voltage assumes a voltage value at which the power semiconductor switch is switched on and the primary voltage of the power semiconductor switch applied between the first and second control device terminals exceeds a second power semiconductor switch primary voltage value which is greater than the first power semiconductor switch primary voltage value, wherein the actuating device is configured, upon the reception of the second high-current signal, and independently of the reception of a switching on command or an switching off command, to generate an actuating voltage for the switching off of the power semiconductor switch. Consequently, e.g. in the event of a short-circuit, the reliable and permanent switching off of the power semiconductor switch is achieved.

Moreover, a power semiconductor circuit having a power semiconductor switch and having a control device for the power semiconductor switch according to the invention, wherein the first control device terminal is connected to the first load current terminal of the power semiconductor switch in an electrically conductive manner, the second control device terminal is connected to the second load current terminal of the power semiconductor switch in an electrically conductive manner, and the third control device terminal is connected to the control terminal of the power semiconductor switch in an electrically conductive manner, has proved to be advantageous.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
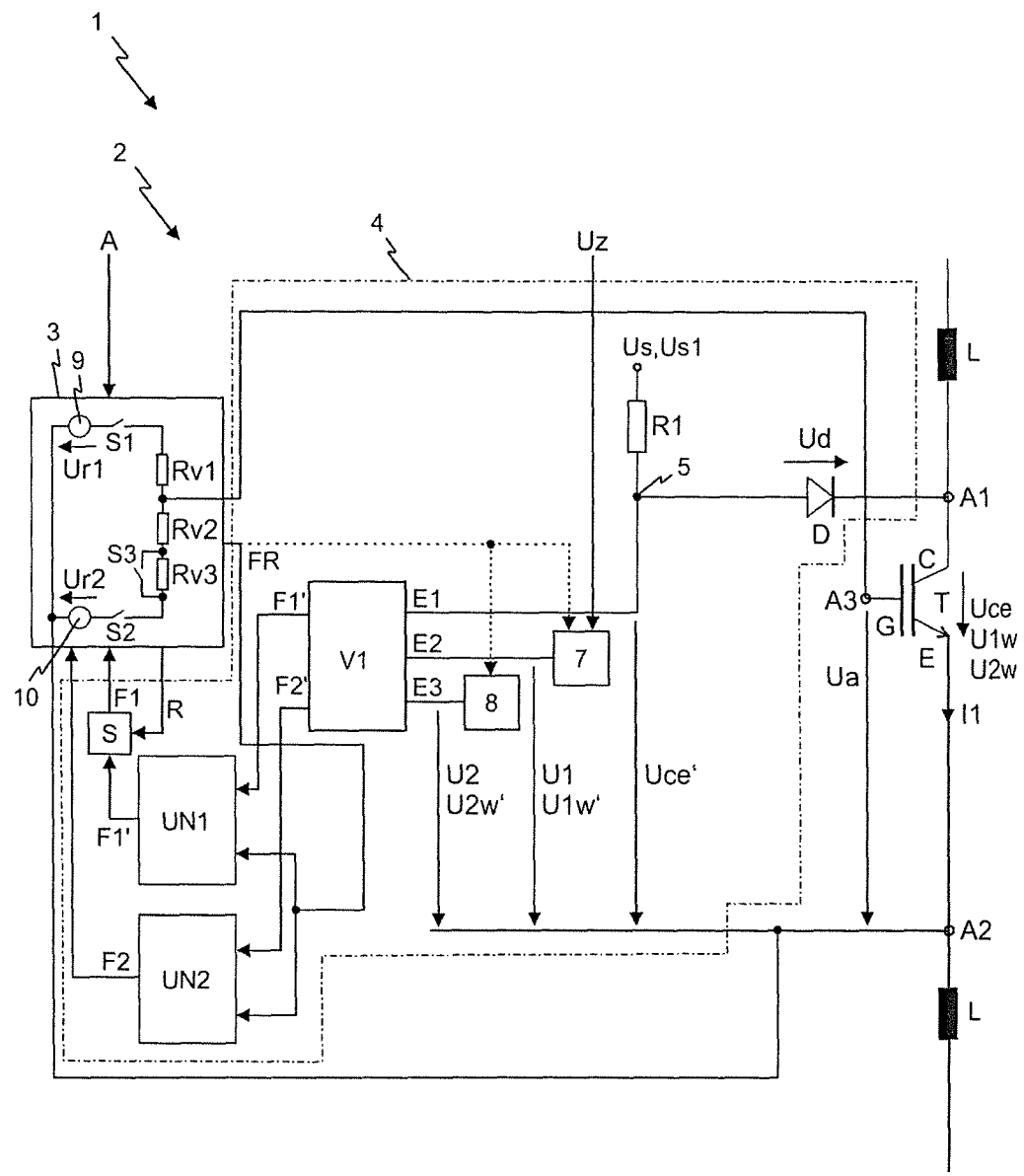
FIG. 1 shows a power semiconductor circuit having a power semiconductor switch and having a control device for the power semiconductor switch according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure. Thus, the appearances of phrases such as "in one variant," "in one version," and the like, in various places in the specification are not necessarily all referring to the same version or variant, nor are separate or alternative versions or variants mutually exclusive of other versions or variants. Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items. Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

FIG. 1 represents a power semiconductor circuit 1, having a power semiconductor switch T and a control device 2 according to the invention for the power semiconductor switch T, wherein the control device 2 is connected to the power semiconductor switch T in an electrically conductive manner.

The power semiconductor switch T comprises a first and a second load current terminal C and E, and a control terminal G. The power semiconductor switch T is preferably provided in the form of a transistor, such as e.g. an IGBT (Insulated Gate Bipolar Transistor) or a MOSFET (Metal Oxide Semiconductor Field Effect Transistor). In the context of the exemplary embodiment, the power semiconductor switch T is provided in the form of an IGBT, wherein the first load current terminal C is provided in the form of the collector of the IGBT, the second load current terminal E is provided in the form of the emitter of the IGBT, and the control terminal G is provided in the form of the gate of the IGBT. It should be observed that the power semiconductor switch T can also comprise a gate series resistor which is integrated in the power semiconductor switch T, and is electrically connected between the gate of the power semiconductor switch T and the control terminal of the power semiconductor switch T, such that the control terminal of the power semiconductor switch T is not provided directly in the form of the gate G of the power semiconductor switch T, but in the form of an electrical terminal of the gate series resistor.

The control device 1 comprises a first electrical control device terminal A1, which is provided for electrical connection with the first load current terminal C of the power semiconductor switch T, a second electrical control device terminal A2, which is provided for electrical connection with the second load current terminal E, and a third electrical control device terminal A3, which is provided for electrical connection with the control terminal G of the power semiconductor switch T.

The first control device terminal A1, in the power semiconductor circuit 1, is electrically connected to the first load current terminal C of the power semiconductor switch T, the second control device terminal A2 is electrically connected to the second load current terminal E of the power semiconductor switch T, and the third control device terminal A3 is electrically connected to the control terminal G of the power semiconductor switch T.

The control device 2 further comprises an actuating device 3 which is designed, on the third control device terminal A3, upon the reception of a switching on command, to generate an actuating voltage Ua for the switching on of the power semiconductor switch T and, upon the reception of an switching off command, to generate an actuating voltage Ua for the switching off of the power semiconductor switch T. To this end, the actuating device 3 receives a control signal A, which is generated e.g. by a superordinate controller (not represented), wherein, in the context of the exemplary embodiment, the switching on command is provided in the form of a high level (logic value "1") and the switching off command is provided in the form of a low level (logic value "0") of the control signal A. In the exemplary embodiment, the actuating device 3 generates an actuating voltage Ua having a first actuating voltage value Uv1 of 15V, for the switching on of the power semiconductor switch T, and an actuating voltage Ua having a third actuating voltage value Uv3 of −8V for the switching off of the power semiconductor switch T on the third control device terminal A3. The power semiconductor switch T is switched on and switched off, in accordance with the voltage value of the actuating voltage Ua. In the exemplary embodiment, the control device 2, for the generation of the actuating voltage Ua, comprises a first voltage source 9, which generates a first voltage Ur1 having a constant voltage value of preferably +15V, and a second voltage source 10, which generates a second voltage Ur2 having a constant voltage value of preferably −8V. The first voltage source 9 is connected via a first switch S1 and a first electrical gate series resistor Rv1 to the third control device terminal A3, in an electrically conductive manner. The second voltage source 10 is connected via a second switch S2, via a second electrical gate series resistor Rv2 and via a third electrical gate series resistor Rv3, which is electrically connected in series with the second gate series resistor Rv2, to the third control device terminal A3, in an electrically conductive manner. The third gate series resistor Rv3, by means of a third switch S3 which is electrically connected in parallel with the third gate series resistor Rv3, can be short-circuited, and thus electrically bypassed. The switches S1 to S3 are configured as semiconductor switches. In normal duty, i.e. if, after the switching on process, no high electrical load current I1 flows in the power semiconductor switch T, the third switch S3 is closed.

Figure 2:
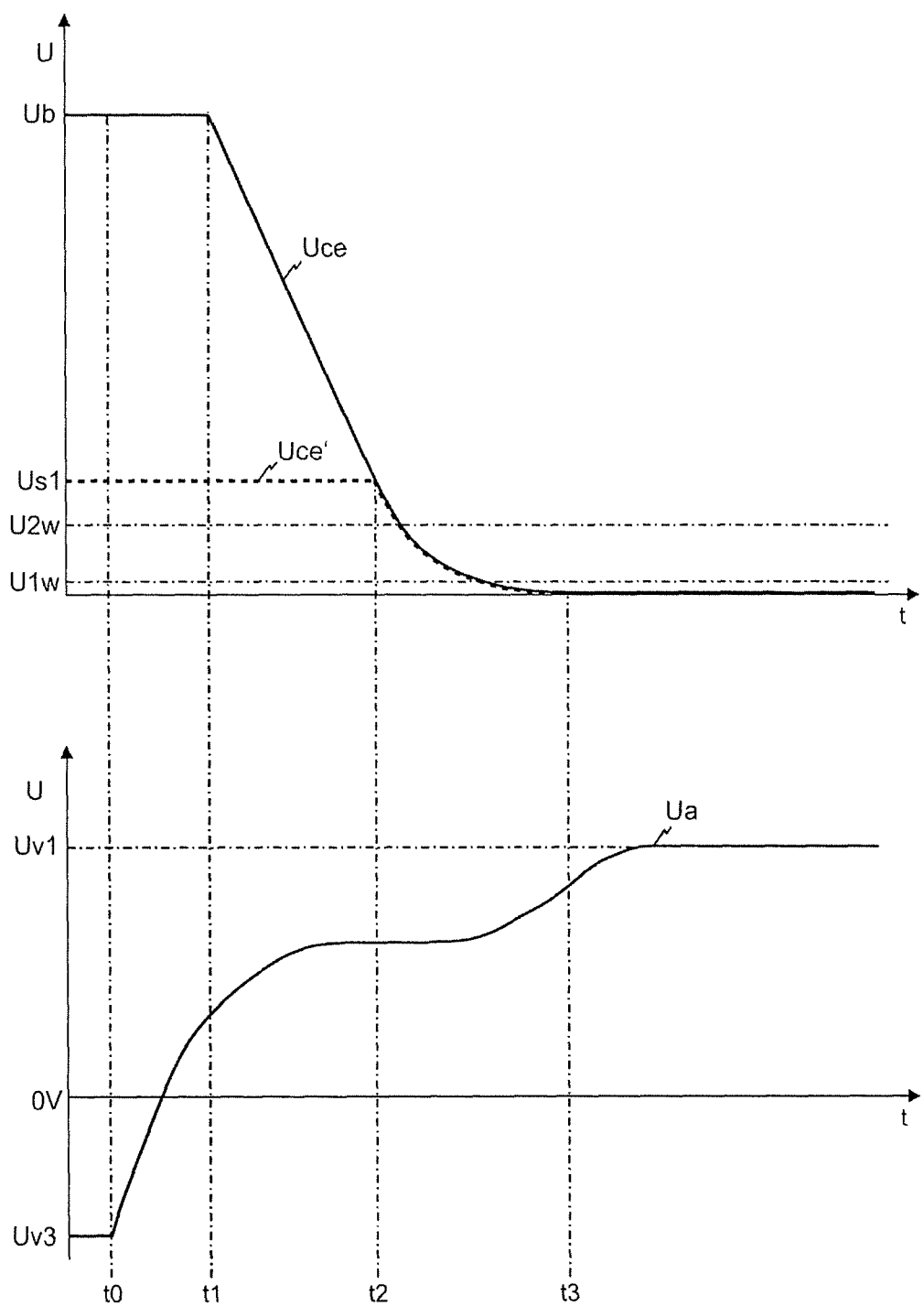
FIG. 2 shows the voltage characteristics of the power semiconductor circuit in normal duty, during and after a switching on process of the power semiconductor switch.

FIG. 2 represents the voltage characteristics of the power semiconductor circuit 1 with the power semiconductor switch T in normal duty, i.e. where, as already described above, after the switching on process, no high electrical load current I1 flows in the power semiconductor switch T. In the switching off state of the power semiconductor switch T, i.e. immediately in advance of time point t0, the second switch S2 is closed and the first switch S1 is opened. The actuating voltage Ua, directly prior to the first time point t0, thus assumes a third actuating voltage value Uv3 of −8V, as the gate-emitter capacitance of the power semiconductor switch T is charged via the second gate series resistor Rv2 to the voltage value −8V of the second voltage source 10. At time point t0, the actuating device 3 receives a switching on command, in response to which it closes the first switch S1 and opens the second switch S2, and the gate-emitter capacitance of the power semiconductor switch T is thus charged via the first gate series resistor Rv1 to a first actuating voltage value Uv1 of +15V by the first voltage source 9. At time point t1, the actuating voltage Ua achieves a voltage value at which the power semiconductor switch T commences its switching on process. The power semiconductor switch primary voltage Uce applied between the first and the second control device terminals A1 and A2 decays as the voltage value of the actuating voltage Ua continues to rise. With effect from time point t3, the actuating voltage Ua assumes a voltage value at which the power semiconductor switch T shows its minimum transit resistance between its first and second load current terminals A1 and A2. With effect from time point t3, the actuating voltage Ua thus assumes a voltage value at which the power semiconductor switch T is switched on. The power semiconductor switch T is thus switched on with effect from time point t3.

Figure 3:
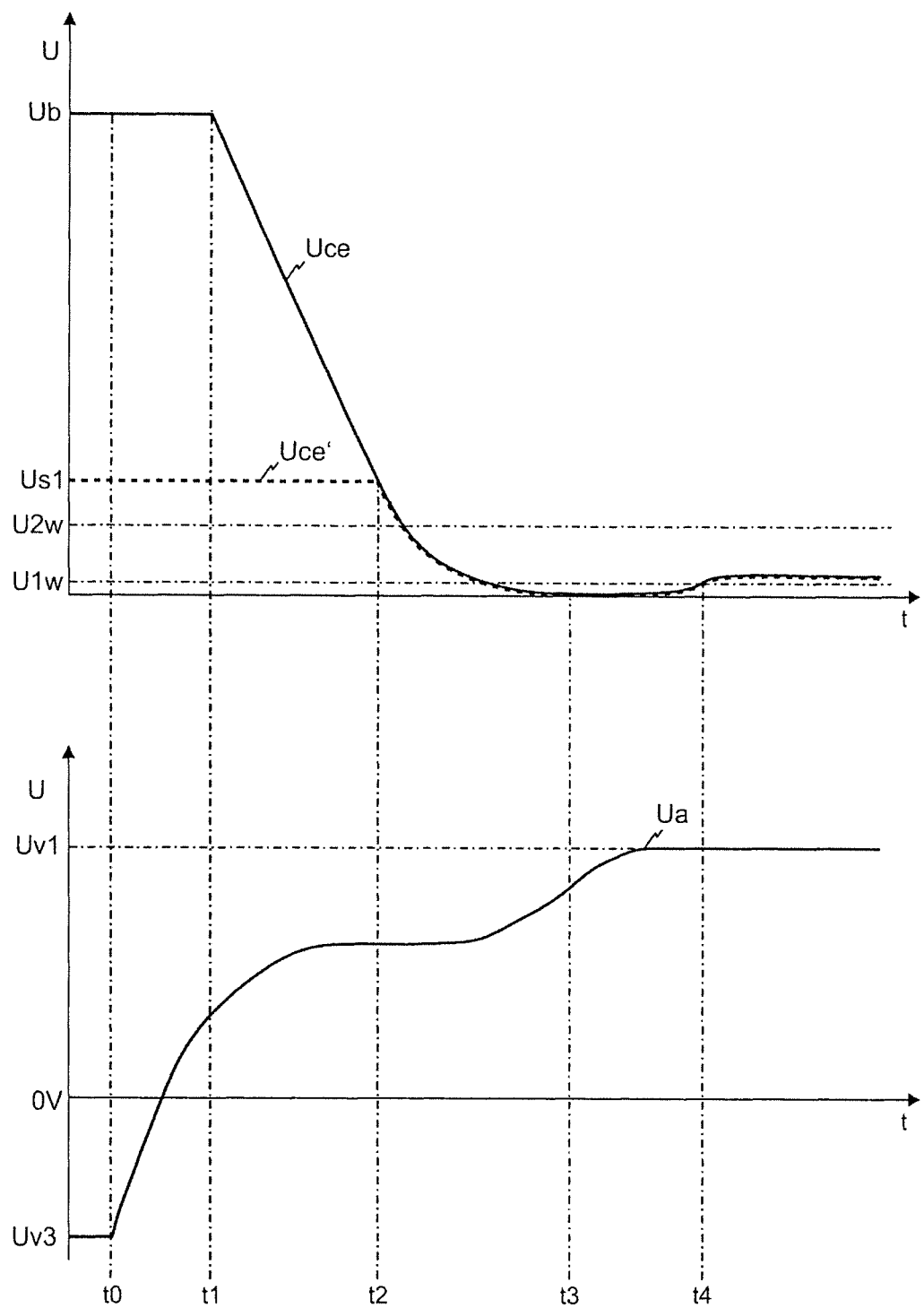
FIG. 3 shows the voltage characteristics of the power semiconductor circuit, during and after a switching on process of the power semiconductor switch, if a high electrical load current commences to flow in the power semiconductor switch after the switching on process.

The control device 2 further comprises a current detection circuit 4, which is designed to generate a first high-current signal F1, if the actuating voltage Ua assumes a voltage value at which the power semiconductor switch T is switched on, and the power semiconductor switch primary voltage Uce applied between the first and the second control device terminals A1 and A2 exceeds a first power semiconductor switch primary voltage value U1w. The first high-current signal F1 is saved by the current detection circuit 4. FIG. 3 represents the voltage characteristics of the power semiconductor circuit 1 in the event that, after the switching on process, a high electrical load current I1 flows in the power semiconductor switch T, of the type which can flow e.g. in the event of a short-term overload operating state. In FIG. 3, by way of a distinction from FIG. 2, after time point t3, with effect from which the power semiconductor switch T is switched on, a high load current I1 occurs which, as a result of the associated higher voltage drop across the power semiconductor switch T, results in an increase in the power semiconductor switch primary voltage Uce. At time point t4, the power semiconductor switch primary voltage Uce exceeds the first power semiconductor switch primary voltage value U1w, such that the current detection circuit 4 generates the first high-current signal F1 with effect from time point t4.

Figure 5:
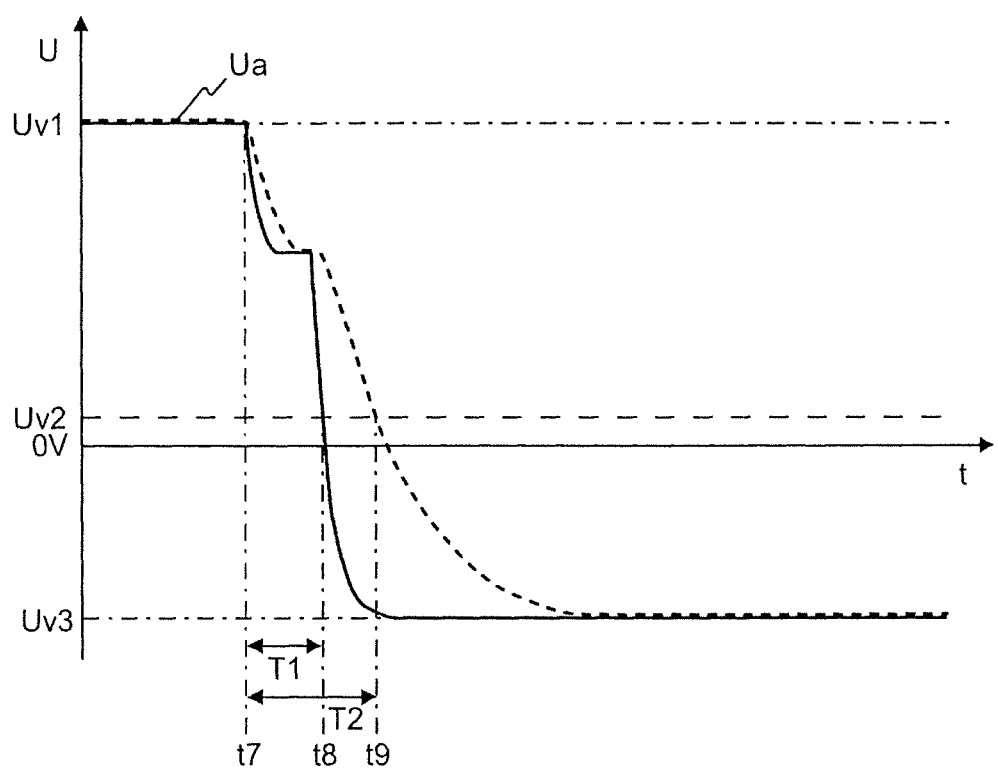
FIG. 5 shows characteristics of the actuating voltage applied to the control device terminal upon the switching off of the power semiconductor switch in normal duty, and in the event of a high electrical load current flowing in the power semiconductor switch.

The actuating device 3 is further designed, upon the reception of an switching off command, to generate an actuating voltage Ua for the switching off of the power semiconductor switch T, such that the actuating voltage Ua is reduced such that the time interval elapsing between a first actuating voltage value Uv1, assumed by the actuating voltage Ua upon the reception of the switching off command, and the achievement of a second actuating voltage value Uv2 of the actuating voltage, which is equal to 10% of the first actuating voltage value Uv1, is greater in the presence of the first high-current signal F1 than in the absence of the first high-current signal F1. FIG. 5 represents the characteristic of the actuating voltage Ua for the opening of the power semiconductor switch T, where the first high-current signal F1 is not present, in the form of the solid-line curve, and the characteristic of the actuating voltage Ua for the switching off of the power semiconductor switch T, where the first high-current signal F1 is present, in the form of the broken-line curve. At time point t7, at which the actuating device 3 receives the switching off command, the actuating voltage Ua assumes the first actuating voltage value Uv1 which, in the exemplary embodiment, is 15V, as the power semiconductor switch T is switched on at time point t7. At time point t7, the first switch S1 is then opened, and the second switch S2 is closed. If no first high-current signal F1 is present, the third switch S3 is then closed such that the third gate series resistor Rv3 is bypassed, and the gate-emitter capacitance of the power semiconductor switch T is discharged by the second voltage source via the second gate series resistor Rv2 until such time as the actuating voltage Ua assumes the third actuating voltage value Uv3 which, in the exemplary embodiment, is −8V. At time point t8, the actuating voltage Ua is reduced by the actuating device 3 from the first actuating voltage value Uv1 to a second actuating voltage value Uv2, which is equal to 10% of the first actuating voltage value Uv1. If the first high-current signal F1 is present, the third switch S3 is then opened, such that the third gate series resistor Rv3 is effective, and the gate-emitter capacitance of the power semiconductor switch T is discharged by the second voltage source S2, via the second gate series resistor Rv2 and the third gate series resistor Rv3, until such time as the actuating voltage Ua assumes the third actuating voltage value Uv3 which, in the exemplary embodiment, is −8V. At time point t9 the actuating voltage Ua is reduced by the actuating device 3 from the first actuating voltage value Uv1 to the second actuating voltage value Uv2, which is equal to 10% of the first actuating voltage value Uv1. The discharging process of the gate-emitter capacitance of the power semiconductor switch T is of longer duration with the third gate series resistor Rv3 effective, rather than with the third gate series resistor Rv3 short-circuited and thus not effective. Consequently, the time interval T2 between time point t7 and time point t9 is greater than the time interval T2 between time point t7 and time point t8.

According to the invention, switching of the power semiconductor switch T thus proceeds more slowly in the presence of the first high-current signal F1 than in the absence of the first high-current signal F1, with the consequence that, upon the switching off of the power semiconductor switch T, in the presence of the first high-current signal F1, the rate of current variation of the load current I1 is smaller than in the absence of the first high-current signal F1. In turn, this has the consequence that, upon the switching off of the power semiconductor switch, overvoltages between the two load current terminals A1 and A2 of the power semiconductor switch T, owing e.g. to stray inductances L of the feeder lines to the power semiconductor switch T, are reduced. The power semiconductor switch T can thus be reliably operated, even at high load currents. However, slow switching off of the power semiconductor switch T has a disadvantage, in that losses associated with the switching off of the power semiconductor switch T are increased. According to the invention, however, slow switching off of the power semiconductor switch T is only executed at high load currents I1, i.e. where this is absolutely necessary for the prevention of overvoltages, and not in general, such that, by means of the invention, in the normal duty of the power semiconductor switch T, operation of the power semiconductor switch T with a high degree of efficiency is possible. The first power semiconductor switch primary voltage value U1w can e.g. be selected such that the first power semiconductor switch primary voltage value U1w, with the power semiconductor switch T in the switched on state, is exceeded if the current intensity of the load current I1 exceeds 1.5 times the rated current intensity of the load current I1.

The first high-current signal F1, after the switching off of the power semiconductor switch T, is cleared by the control device 2, such that it is no longer present. Preferably, the first high-current signal F1 is cleared by the control device 2, where an actuating voltage Ua is generated by the actuating device 3 for the switching on of the power semiconductor switch T. Accordingly, any switching off process of the power semiconductor switch T can be executed rapidly or slowly.

It will be observed that the slower discharge process of the gate-emitter capacitance of the power semiconductor switch T, in the event of the presence of the first high-current signal F1, can be realized in a variety of ways. Thus, for example, the slower discharge process of the gate-emitter capacitance of the power semiconductor switch T, in the event of the presence of the first high-current signal F1, rather than by the above-mentioned use of a third gate series resistor Rv3 that can be switched in, can also be achieved by a variation in the constant voltage value of the second voltage Ur2, from e.g. −8V to 0V, in the event of the presence of the first high-current signal F1.

The time interval with effect from the first actuating voltage value Uv1, which is assumed by the actuating voltage Ua upon the reception of the switching off command, i.e. at the time point t7, up to the achievement of the second actuating voltage value Uv2 (time point t8 or t9), in the presence of the first high-current signal F1, is at least 10%, in particular at least 20% greater, than in the absence of the first high-current signal F1. The time interval T2 is thus preferably at least 10% greater, and in particular at least 20% greater, than the time interval T1.

The control device 2 can be configured for the reception of an intermediate circuit voltage value Uz, wherein the first power semiconductor switch primary voltage value Uv1 is dependent upon the intermediate circuit voltage value Uz such that the first power semiconductor switch primary voltage value Uv1 in the event of a high intermediate circuit voltage value Uz is lower than in the event of a low intermediate circuit voltage value Uz. If the power semiconductor switch T is a constituent of a half-bridge circuit of the conventional type employed in power electronics, the intermediate circuit voltage of the half-bridge circuit will then be present on the half-bridge circuit. In the event of a high intermediate circuit voltage, the power semiconductor switch T, in the switched off state, receives a higher voltage load than in the event of a low intermediate circuit voltage. It is therefore advantageous the first power semiconductor switch primary voltage value Uv1, in the event of a high intermediate circuit voltage, to be lowered, such that the current detection circuit generates the first high-current signal F1, even in the event of a relatively small load current I1.

Figure 4:
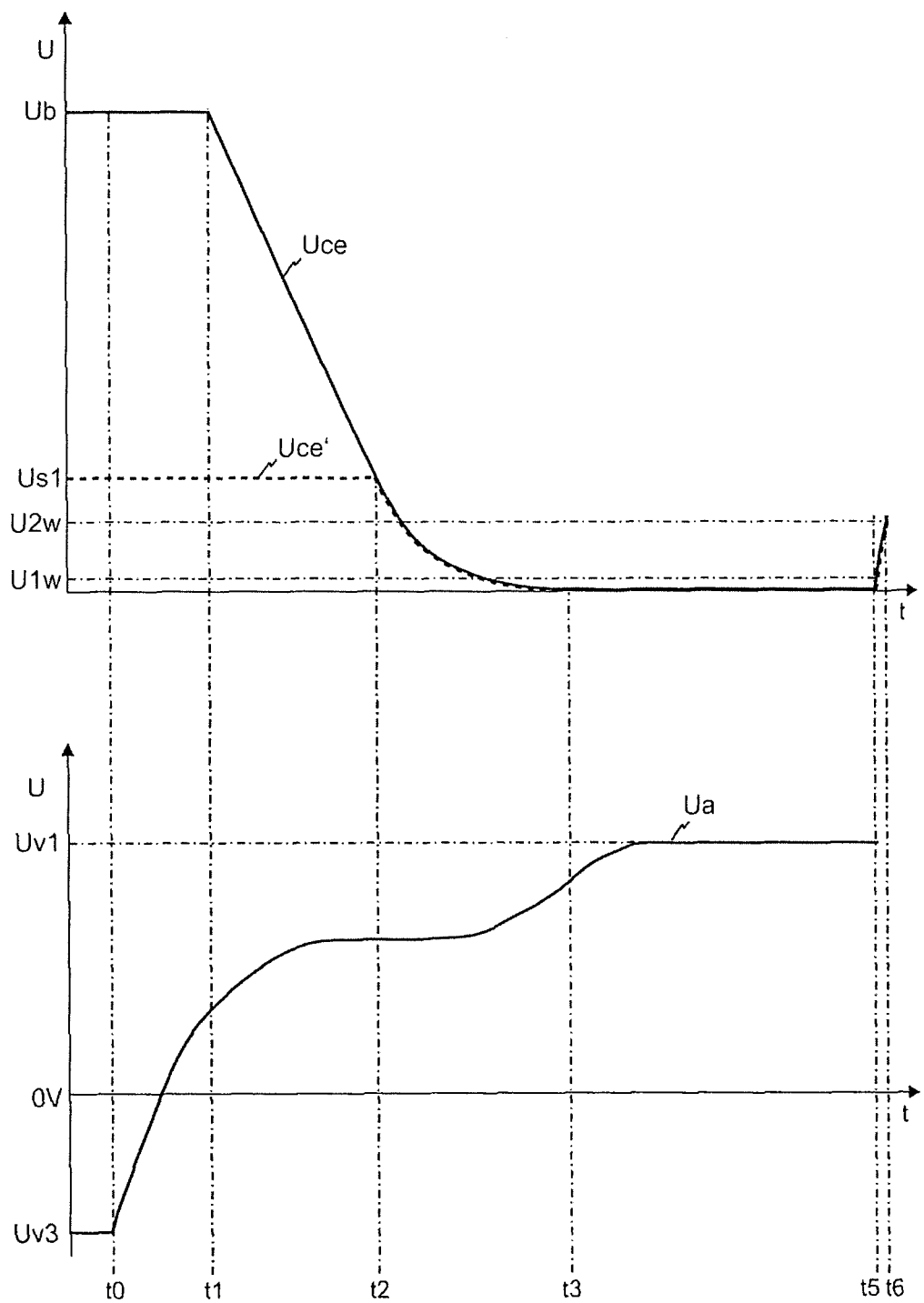
FIG. 4 shows the voltage characteristics of the power semiconductor circuit, during and after a switching on process of the power semiconductor switch, if a very high electrical load current commences to flow in the power semiconductor switch after the switching on process.

The current detection circuit 4 is preferably configured to generate a second high-current signal F2, where the actuating voltage Ua assumes a voltage value at which the power semiconductor switch T is switched on, and the power semiconductor switch primary voltage Uce which is applied between the first and the second control device terminals A1 and A2 exceeds a second power semiconductor switch primary voltage value U2w, which is greater than the first power semiconductor switch primary voltage value U1w, wherein the actuating device 3 is configured, upon the reception of the second high-current signal F2, and independently of the reception of a switching on command or an switching off command, to generate an actuating voltage Ua for the switching off of the power semiconductor switch T. FIG. 4 represents the voltage characteristics of the power semiconductor circuit 1 in the event that, after the switching on process, a very high electrical load current I1 flows through the power semiconductor switch T, of the type associated e.g. with a short-circuit. In FIG. 4, by way of a distinction from FIG. 2, a short-circuit occurs at time point t5, which results in a very high load current I1, and consequently a high rise in the power semiconductor switch primary voltage Uce. At time point t6, the power semiconductor switch primary voltage Uce exceeds the second power semiconductor switch primary voltage value U2w, such that the current detection circuit 4 generates the second high-current signal F2. The actuating device 3, upon the reception by the latter of the second high-current signal, and independently of the reception of a switching on command or an switching off command, generates an actuating voltage Ua for the switching off of the power semiconductor switch T, and thus permanently switches off the power semiconductor switch T. As, inevitably, the first high-current signal F1 is also present, the power semiconductor switch T is switched off slowly. If this is not desired, the power semiconductor switch T, upon the reception of the second high-current signal F2, can also be switched off rapidly by the actuating device, even though the first high-current signal F1 is present.

The circuit layout of the actuating device 2 is described hereinafter.

The current detection circuit 4 comprises a diode D, an electrical resistor R1, a first and a second voltage generating device 7 and 8, a first and a second AND logic element UN1 and UN2, which respectively constitute an AND logic dependency of the input signals thereof, a comparator V1 and a flip-flop S. A first input E1 of the comparator V1 is connected to a second terminal of the resistor R1 and to the anode of the diode D1 in an electrically conductive manner. On a second terminal of the resistor R1, a supply voltage Us is applied, having a voltage value Us1 of e.g. 15V. The cathode of the diode D1 is connected to the first control device terminal A1 in an electrically conductive manner.

The comparator V1 generates a first preliminary high-current signal F1', where the voltage Uce' applied to its first input E1 is greater than the voltage value U1w' of a first voltage U1 applied to the second input E2 of the comparator V1, which is generated by the first voltage generating device 7. The comparator V1 generates a second high-current signal F2', where the voltage Uce' applied to its first input E1 is greater than the voltage value U2w' of a second voltage U2 applied to a third input E3 of the comparator V1, which is generated by the second voltage generating device 8.

The diode D, with the power semiconductor switch T switched off, is in a non-conducting state, and isolates the high voltage level on the side of the power semiconductor switch T from the low voltage level on the side of the control device 2. In FIGS. 2 to 4, the characteristic of the voltage Uce' is represented by a broken line. Immediately, upon the switching on of the power semiconductor switch T, the power semiconductor switch primary voltage Uce falls below the voltage value Us1, the diode D becomes electrically conductive, and the voltage Uce', ignoring the voltage drop Ud across the diode, corresponds to the power semiconductor switch primary voltage Uce. The voltage value U1w', ignoring the voltage drop Ud across the diode, corresponds to the first power semiconductor switch primary voltage value U1w, and the voltage value U2w' corresponds to the second power semiconductor switch primary voltage value U2w. It will be observed that, if the voltage Uce' applied to the circuit nodes 5 is further subdivided, e.g. by means of a voltage divider, and the subdivided voltage is applied to the first input E1, the first power semiconductor switch primary voltage value U1w is determined by a corresponding back calculation from the voltage value U1w' and the second power semiconductor switch primary voltage value U1w is determined by a corresponding back calculation from the voltage value U2w'. For each voltage value U1w' or U2w', a corresponding first or second power semiconductor switch primary voltage value U1w or U2w is indicated in each case.

In order to prevent spurious tripping, any relaying of the two preliminary high current signals F1' and F2' via the two AND elements UN1 and UN2 is blocked until time point t3, at which the power semiconductor switch T is switched on. To this end, the actuating device 3, where the actuating voltage Ua assumes a voltage value at which the power semiconductor switch T is switched on, i.e. in the exemplary embodiment, with effect from time point t3, generates a release signal FR having a HIGH logic level (logic value "1"). Prior to time point t3, the release signal FR assumes a LOW logic level (logic value "0"). It will be observed, however, that the actuating device 3, according to the invention, can also be configured such that the actuating device 3 generates the release signal FR with effect from a specific and fixed time interval after the reception of a switching on signal, wherein the time interval is selected such that the release signal FR is generated no earlier than time point t3.

If, in the exemplary embodiment, the voltage Uce' with effect from time point t3 exceeds the first voltage value U1w', the first preliminary high current signal F1' is generated by the comparator V1, and is relayed via the first AND element UN1 to the input of the flip-flop S, where it is saved, and the first high-current signal F1 is generated on its output, and is relayed to the actuating device 3. The actuating device 3, by means of the first high-current signal F1, actuates the third switch S3 such that, in the presence of the first high-current signal F1, the third switch S3 is opened, and is closed in the absence of the first high-current signal F1. The FLIP-FLOP S, and thus the first high-current signal F1, after the switching off of the power semiconductor switch T, is cleared by the control device 2, wherein the actuating device 3, after the switching off of the power semiconductor switch T, transmits a reset signal R to a reset input of the FLIP-FLOP S, and thus resets the FLIP-FLOP S, such that the first high-current signal F1 is no longer present. Preferably, the first high-current signal F1 is cleared, if an actuating voltage Ua is generated by the actuating device 3 for the switching on of the power semiconductor switch T. Accordingly, any switching off process of the power semiconductor switch T can be executed rapidly or slowly.

The first power semiconductor switch primary voltage value U1w, and thus the voltage value U1w', as in the exemplary embodiment, can be temporally constant. In this case, the first voltage U1 assumes a temporally constant voltage value U1w'.

However, the first power semiconductor switch primary voltage value U1w, and thus the voltage value U1w', can also be temporally inconstant. In this case, the first voltage U1 assumes no temporally constant voltage value U1w'. The voltage value U1w', and thus the first power semiconductor switch primary voltage value U1w, can vary e.g. in accordance with the typical characteristic of a voltage which, upon the discharging of a capacitor by means of a resistor, is applied to the electrical terminals of the capacitor, until a specific minimum value for the voltage is achieved. Thus, the voltage value U1w', up to the time point t3, can be higher than the voltage value Us1, such that the generation of the first high-current signal F1 is generally blocked up to the time point t3, given that the circuit arrangement dictates that the voltage Uce' cannot be higher than the voltage value Us1. Commencing at time point t3, in this case, the voltage value U1w', and thus the first power semiconductor switch primary voltage value U1w corresponding to the above-mentioned capacitor discharge characteristic, declines until a specific first minimum value is achieved, shortly after time point t3, whereafter said value remains at least approximately constant over the further course of time. In this case, the first AND element UN1 can be omitted.

If, in the exemplary embodiment, the voltage Uce', with effect from time point t3, exceeds the second voltage value U2w', the second preliminary high-current signal F2' is generated by the comparator V1 and, via the second AND element UN2, is relayed as a second high-current signal F2 to the actuating device 3 which, upon the reception of the second high-current signal F2, independently of the reception of a switching on command or an switching off command, and thus continuously, generates an actuating voltage Ua for the switching off of the power semiconductor switch T. To this end, the second high-current signal F2 is saved by the actuating device 3.

The second power semiconductor switch primary voltage value U2w, and thus the voltage value U2w', as in the exemplary embodiment, can be temporally constant. In this case, the second voltage U2 assumes a temporally constant voltage value U2w'.

However, the second power semiconductor switch primary voltage value U2w, and thus the voltage value U1w', can also be temporally inconstant. In this case, the second voltage U2 does not assume a temporally constant voltage value U2w'. The voltage value U2w', and thus the second power semiconductor switch primary voltage value U2w, can vary e.g. in accordance with the typical characteristic of a voltage which, upon the discharging of a capacitor by means of a resistor, is applied to the electrical terminals of the capacitor, until a specific minimum voltage value is achieved. Thus, the voltage value U2w' up to time point t3 can be higher than the voltage value Us1, such that the generation of the second high-current signal F2 is generally blocked up to time point t3, given that the circuit arrangement dictates that the voltage Uce' cannot be higher than the voltage value Us1. Commencing at time point t3, in this case, the voltage value U2w', and thus the second power semiconductor switch primary voltage value U2w corresponding to the above-mentioned capacitor discharge characteristic, declines until a specific second minimum value is achieved, shortly after time point t3, whereafter said value remains at least approximately constant over the further course of time. In this case, the second AND element UN2 can be omitted. The second minimum value is thus higher than the first minimum value.

It will be observed that, in the actuating device 3, the circuit arrangement represented in FIG. 1 can also be modified, e.g. such that, in place of the parallel connection of the third switch S3 with the third gate series resistor Rv3, the third switch S3 can also be electrically connected in series with the third gate series resistor Rv3, and the series circuit arrangement of the third switch S3 and the third gate series resistor Rv3 can be electrically connected in parallel with the series circuit arrangement of the second switch S2 and the second gate series resistor Rv2.

It is further observed that, naturally, characteristics of the various exemplary embodiments of the invention, provided that said characteristics are not mutually exclusive, can be mutually combined as desired, without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A control device for a power semiconductor switch, having a first and a second load current terminal and a control terminal, comprising:
    a first electrical control device terminal, which provides for electrical connection with the first load current terminal, a second electrical control device terminal, which provides for electrical connection with the second load current terminal, and a third electrical control device terminal, which provides for electrical connection with the control terminal;
    an actuating device, which is designed, on the third control device terminal, upon the reception of a switching on command, to generate an actuating voltage (Ua) for the switching on of the power semiconductor switch and, upon the reception of an switching off command, to generate an actuating voltage (Ua) for the switching off of the power semiconductor switch;
    a current detection circuit, which generates a first high-current signal (F1) if the actuating voltage (Ua) assumes a voltage value at which the power semiconductor switch is switched on, and a primary voltage of the power semiconductor switch applied between the first and second control device terminals exceeds a first power semiconductor switch primary voltage value (U1w); and
    wherein the actuating device is configured upon the reception of an switching off command to generate an actuating voltage (Ua) for the switching off of the power semiconductor switch, such that the actuating voltage (Ua) is reduced such that the time interval (T1, T2) elapsing between a first actuating voltage value (Uv1), assumed by the actuating voltage (Ua) upon the reception of the switching off command, and the achievement of a second actuating voltage value (Uv2) of the actuating voltage, which is equal to 10% of the first actuating voltage value (Uv1), is greater in the presence of the first high-current signal than in the absence of the first high-current signal.

2. The control device, according to claim 1, wherein:
the control device is configured for the reception of an intermediate circuit voltage value (Uz), and the first power semiconductor switch primary voltage value (Uv1) is dependent upon the intermediate circuit voltage value (Uz), such that the first power semiconductor switch primary voltage value (Uv1) in the event of a high intermediate circuit voltage value (Uz) is lower than in the event of a low intermediate circuit voltage value (Uz).

3. The control device, according to claim 1, wherein:
the actuating device is designed, upon the reception of an switching off command, to generate an actuating voltage (Ua) for the switching off of the power semiconductor switch, such that the actuating voltage (Ua) is reduced such that the time interval (T1, T2) elapsing between a first actuating voltage value (Uv1), assumed by the actuating voltage (Ua) upon the reception of the switching off command, and the achievement of a second actuating voltage value (Uv2) of the actuating voltage (Ua), which is equal to 10% of the first actuating voltage value (Uv1), is at least 10% greater, in particular at least 20% greater, in the presence of the first high-current signal than in the absence of the first high-current signal.

4. The control device, according to claim 1, wherein:
the current detection circuit is designed to generate a second high-current signal, if the actuating voltage (Ua) assumes a voltage value at which the power semiconductor switch is switched on and the primary voltage of the power semiconductor switch applied between the first and second control device terminals exceeds a second power semiconductor switch primary voltage value (U2w) which is greater than the first power semiconductor switch primary voltage value (U1w), wherein the actuating device is configured, upon the reception of the second high-current signal, and independently of the reception of a switching on command or an switching off command, to generate an actuating voltage (Ua) for the switching off of the power semiconductor switch.

5. A power semiconductor circuit, having a power semiconductor switch and having a control device for the power semiconductor switch, which is configured according to claim 1, wherein:
wherein the first control device terminal is connected to the first load current terminal of the power semiconductor switch in an electrically conductive manner, the second control device terminal is connected to the second load current terminal of the power semiconductor switch in an electrically conductive manner, and the third control device terminal is connected to the control terminal of the power semiconductor switch in an electrically conductive manner.

* * * * *